United States Patent
Kronfeld et al.

(10) Patent No.: US 12,107,611 B2
(45) Date of Patent: Oct. 1, 2024

(54) RECEIVER WITH REDUCED NOISE FIGURE USING SPLIT LNA AND DIGITAL COMBINING

(71) Applicant: Intel Corporation, Santa Clara, CA (US)

(72) Inventors: Ronen Kronfeld, Shoham (IL); Rula Jubran, Haifa (IL)

(73) Assignee: Intel Corporation, Santa Clara, CA (US)

( * ) Notice: Subject to any disclaimer, the term of this patent is extended or adjusted under 35 U.S.C. 154(b) by 779 days.

(21) Appl. No.: 17/119,543

(22) Filed: Dec. 11, 2020

(65) Prior Publication Data

US 2022/0190860 A1   Jun. 16, 2022

(51) Int. Cl.
| | |
|---|---|
| H04B 1/18 | (2006.01) |
| H04B 1/00 | (2006.01) |
| H04B 1/12 | (2006.01) |
| H04B 1/16 | (2006.01) |

(52) U.S. Cl.
CPC .............. *H04B 1/18* (2013.01); *H04B 1/005* (2013.01); *H04B 1/12* (2013.01); *H04B 1/1607* (2013.01)

(58) Field of Classification Search
CPC ............ H04B 1/18; H04B 1/005; H04B 1/12; H04B 1/1607; H04B 1/16; H03F 2200/294; H03F 1/126; H03F 1/42
See application file for complete search history.

(56) References Cited

U.S. PATENT DOCUMENTS

| | | | |
|---|---|---|---|
| 6,351,502 B1 | 2/2002 | Zargari | |
| 6,366,622 B1 | 4/2002 | Brown et al. | |
| 6,694,129 B2 | 2/2004 | Peterzell et al. | |
| 6,748,200 B1 | 6/2004 | Webster et al. | |
| 6,816,718 B2 | 11/2004 | Yan et al. | |
| 6,903,606 B1 | 6/2005 | Yan et al. | |
| 7,013,117 B2 | 3/2006 | Darabi | |
| 7,023,374 B2 | 4/2006 | Jossef et al. | |
| 7,024,169 B2 | 4/2006 | Ciccarelli et al. | |
| 7,280,812 B2 | 10/2007 | Demir et al. | |
| (Continued) | | | |

FOREIGN PATENT DOCUMENTS

| | | |
|---|---|---|
| CA | 2474350 | 6/2004 |
| CN | 101388681 | 11/2012 |
| (Continued) | | |

OTHER PUBLICATIONS

"European Application Serial No. 21198379.6, Extended European Search Report mailed Mar. 18, 2022", 9 pgs.

(Continued)

*Primary Examiner* — Dac V Ha

(74) *Attorney, Agent, or Firm* — Schwegman Lundberg & Woessner, P.A.

(57) ABSTRACT

Systems and methods of reducing SNR and increasing bandwidth of received signals are disclosed. LNAs receive signals from an antenna via a common input matching network. The amplified signals are downconverted, filtered and digitized before being coherently combined at a DSP. Depending on the LO frequencies used by mixers in the different receiver paths, the combined signals reduce the SNR when the LO frequencies are the same by reducing the non-correlated noise introduced by the LNAs or increase the bandwidth processed when the LO frequencies are different. The bandwidths are contiguous or non-contiguous.

20 Claims, 7 Drawing Sheets

(56) References Cited

U.S. PATENT DOCUMENTS

| | | | |
|---|---|---|---|
| 7,333,831 B2 | 2/2008 | Srinivasan et al. | |
| 7,336,745 B2* | 2/2008 | Casabona | H04B 7/18513 |
| | | | 455/278.1 |
| 7,372,925 B2 | 5/2008 | Pipilos | |
| 7,450,853 B2 | 11/2008 | Kim et al. | |
| 7,477,918 B2 | 1/2009 | Wu | |
| 7,519,390 B2 | 4/2009 | Malone et al. | |
| 7,529,529 B2 | 5/2009 | Taylor | |
| 7,902,923 B2 | 3/2011 | Li et al. | |
| 7,924,944 B2 | 4/2011 | Vassiliou et al. | |
| 8,041,327 B2 | 10/2011 | Youssoufian | |
| 8,150,360 B2 | 4/2012 | Ivonnet et al. | |
| 8,155,611 B2 | 4/2012 | Reis | |
| RE43,367 E | 5/2012 | Webster et al. | |
| 8,180,312 B2 | 5/2012 | Brobston et al. | |
| 8,208,881 B2 | 6/2012 | Wu | |
| 8,428,650 B2 | 4/2013 | Pottenger et al. | |
| 8,571,152 B1 | 10/2013 | Chen et al. | |
| 8,611,445 B2 | 12/2013 | Rajendran et al. | |
| 8,620,254 B2 | 12/2013 | Molnar et al. | |
| 8,660,214 B1 | 2/2014 | Huynh | |
| 8,660,221 B2 | 2/2014 | Chen et al. | |
| 8,781,031 B2 | 7/2014 | Casagrande | |
| 8,831,536 B2 | 9/2014 | Rofougaran et al. | |
| 8,861,431 B2 | 10/2014 | Loh et al. | |
| 8,861,620 B2 | 10/2014 | Toosi et al. | |
| 8,989,688 B2 | 3/2015 | Mikhemar et al. | |
| 9,130,600 B2 | 9/2015 | Mikhemar et al. | |
| 9,154,170 B2 | 10/2015 | Mikhemar et al. | |
| 9,237,055 B2 | 1/2016 | Lin et al. | |
| 9,246,438 B2 | 1/2016 | Mikhemar et al. | |
| 9,246,719 B2 | 1/2016 | Pullela et al. | |
| 9,435,838 B1 | 9/2016 | Mckinley et al. | |
| 9,496,906 B2 | 11/2016 | Rafi | |
| 9,584,164 B1 | 2/2017 | Sheikh et al. | |
| 9,991,855 B2* | 6/2018 | Mizokami | H03F 3/45188 |
| 10,135,482 B2 | 11/2018 | Adams et al. | |
| 10,153,934 B1 | 12/2018 | Gathman et al. | |
| 10,326,484 B1 | 6/2019 | Ayranci et al. | |
| 10,979,086 B2* | 4/2021 | Jussila | H04B 1/005 |
| 2002/0111142 A1 | 8/2002 | Klimovitch | |
| 2002/0123319 A1 | 9/2002 | Peterzell | |
| 2005/0197092 A1 | 9/2005 | Darabi | |
| 2006/0068746 A1 | 3/2006 | Feng et al. | |
| 2006/0246842 A1 | 11/2006 | Mohindra | |
| 2006/0279446 A1 | 12/2006 | Wang et al. | |
| 2007/0066271 A1 | 3/2007 | Vavelidis et al. | |
| 2007/0243832 A1 | 10/2007 | Park et al. | |
| 2008/0112519 A1 | 5/2008 | Jung et al. | |
| 2008/0280585 A1 | 11/2008 | Chen et al. | |
| 2010/0182090 A1 | 7/2010 | Yang et al. | |
| 2010/0265875 A1* | 10/2010 | Zhao | H04B 1/0007 |
| | | | 370/316 |
| 2013/0316671 A1 | 11/2013 | Stockinger et al. | |
| 2015/0295596 A1 | 10/2015 | Wloczysiak et al. | |
| 2017/0366876 A1 | 12/2017 | Agrawal et al. | |
| 2019/0049555 A1 | 2/2019 | Sreekiran et al. | |
| 2019/0235050 A1* | 8/2019 | Maligeorgos | G01S 7/032 |
| 2019/0312604 A1 | 10/2019 | Huang et al. | |
| 2020/0059207 A1 | 2/2020 | Sayilir et al. | |
| 2020/0127725 A1 | 4/2020 | Paramesh et al. | |
| 2020/0321994 A1 | 10/2020 | Alam et al. | |
| 2020/0328769 A1* | 10/2020 | Yang | H03F 3/195 |

FOREIGN PATENT DOCUMENTS

| | | |
|---|---|---|
| CN | 202663389 | 1/2013 |
| CN | 102256384 | 1/2014 |
| CN | 102845126 | 4/2015 |
| CN | 102723913 | 7/2015 |
| CN | 105306096 | 2/2016 |
| CN | 105896079 | 8/2016 |
| CN | 106330224 | 1/2017 |
| CN | 103608694 | 3/2017 |
| CN | 103957182 | 3/2017 |
| CN | 206226410 | 6/2017 |
| CN | 104620508 | 7/2017 |
| CN | 107343284 | 11/2017 |
| CN | 108051791 | 5/2018 |
| CN | 108696289 | 10/2018 |
| CN | 109116309 | 1/2019 |
| CN | 208507937 | 2/2019 |
| CN | 105409178 | 3/2019 |
| CN | 109905341 | 6/2019 |
| CN | 109983707 | 7/2019 |
| CN | 109167612 | 10/2019 |
| CN | 110380747 | 10/2019 |
| CN | 110447146 | 11/2019 |
| CN | 110736557 | 1/2020 |
| CN | 111213321 | 5/2020 |
| DE | 102010003660 | 11/2010 |
| DE | 102017002799 | 9/2017 |
| DE | 102018108128 | 10/2018 |
| EP | 1618674 | 1/2006 |
| EP | 1657919 | 5/2006 |
| EP | 1723729 | 11/2006 |
| EP | 1726098 | 11/2006 |
| EP | 1741192 | 1/2007 |
| EP | 1800413 | 6/2007 |
| EP | 1917716 | 5/2008 |
| EP | 2120351 | 11/2009 |
| EP | 2392071 | 12/2011 |
| EP | 2421214 | 5/2013 |
| EP | 2729827 | 5/2014 |
| EP | 3018874 | 5/2016 |
| EP | 3482501 | 5/2019 |
| IN | 2009CN04981 | 11/2009 |
| JP | 4105549 | 4/2008 |
| JP | 2020507230 | 3/2020 |
| KR | 20060064567 | 6/2006 |
| KR | 20060064611 | 6/2006 |
| KR | 20060116828 | 11/2006 |
| KR | 100714699 | 5/2007 |
| KR | 20070062591 | 6/2007 |
| KR | 20080034238 | 4/2008 |
| KR | 20110133002 | 12/2011 |
| KR | 101692242 | 1/2017 |
| KR | 101736876 | 5/2017 |
| KR | 20170058511 | 5/2017 |
| KR | 20190089955 | 7/2019 |
| KR | 102069870 | 1/2020 |
| RU | 2308804 | 10/2007 |
| RU | 2365935 | 8/2009 |
| RU | 2008125962 | 12/2009 |
| RU | 94723 | 5/2010 |
| RU | 2451373 | 5/2012 |
| RU | 167899 | 1/2017 |
| RU | 169481 | 3/2017 |
| RU | 172567 | 7/2017 |
| TW | I269538 | 12/2006 |
| TW | 200742247 | 11/2007 |
| TW | 200931822 | 7/2009 |
| TW | 201029317 | 8/2010 |
| TW | 201838352 | 10/2018 |
| WO | 0036757 | 6/2000 |
| WO | 0152431 | 7/2001 |
| WO | 02056490 | 4/2004 |
| WO | 2004049580 | 6/2004 |
| WO | 2004082136 | 9/2004 |
| WO | 2005002082 | 1/2005 |
| WO | 2005088847 | 9/2005 |
| WO | 2005088849 | 9/2005 |
| WO | 2006035276 | 4/2006 |
| WO | 2006086127 | 8/2006 |
| WO | 2015096010 | 7/2015 |
| WO | 2016149907 | 9/2016 |
| WO | 2019190543 | 10/2019 |

OTHER PUBLICATIONS

Elmaghraby, Ahmed, "A Mixed-Signal Technique for TX-Induced Modulated Spur Cancellation in LTE-CA Receivers", IEEE Trans-

(56) References Cited

OTHER PUBLICATIONS actions on Circuits and Systems I: Regular Papers, IEEE, US vol. 65, No. 9, (Sep. 1, 2018), 3060-3073.
"European Application Serial No. 21198379.6, Response filed Nov. 11, 2022 to Extended European Search Report mailed Mar. 18, 2022", 11 pgs.

* cited by examiner

RECEIVER WITH REDUCED NOISE FIGURE USING SPLIT LNA AND DIGITAL COMBINING

TECHNICAL FIELD

Aspects pertain to communication devices. Some aspects receivers. Some aspects relate to noise figure reduction in a receiver. Some aspects relate to bandwidth reception increases in a receiver.

BACKGROUND

The use of various types of wireless communication devices, such as smart phones and tablets, continues to increase, as does amount of data and bandwidth being used by various applications, such as video streaming, operating on such communication devices. Thus, given the usage, an ever-present desire is to increase the bandwidth used for wireless communications to provide enhanced data services. In addition, independent of the type of wireless communication device, common components exist to enable communication, including both transmitters and receivers (or transceivers). Such components in a signal chain invariably introduce noise into the communication device. Decreasing the noise in a receiver chain, for example, is a continuing area of interest to increase the receiver sensitivity.

The noise figure is one measure of noise in the communication device, in particular signal-to-noise ratio (SNR) degradation. The noise figure is defined as the ratio of the SNR power ratio at the input to the SNR power ratio at the output. The noise figure of a receiver is directly related to receiver sensitivity and dependent on the bandwidth and modulation scheme used by the receiver. The noise figure of modern integrated compound metal-oxide semiconductor (CMOS) transceivers in the WiFi (2-7 GHz) range, is typically limited to approximately 4-5 dB mainly due to integration into a Si substrate of various components of a receiver chain in a time duplexing domain (TDD) receiver in combination with inherent limitations of CMOS technology. Such components include, among others, a low noise amplifier (LNA), Power Amplifier (PA) and transmit/receive (T/R) switch in TDD systems. Accordingly, it is desirable to improve the receiver noise figure, preferably leveraging hardware and components that are already present in modern integrated transceivers, perhaps with the introduction of minimal additional hardware.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various aspects discussed in the present document.

DETAILED DESCRIPTION

The following description and the drawings sufficiently illustrate specific aspects to enable those skilled in the art to practice them. Other aspects may incorporate structural, logical, electrical, process, and other changes. Portions and features of some aspects may be included in, or substituted for, those of other aspects. Aspects set forth in the claims encompass all available equivalents of those claims.

Figure 1:
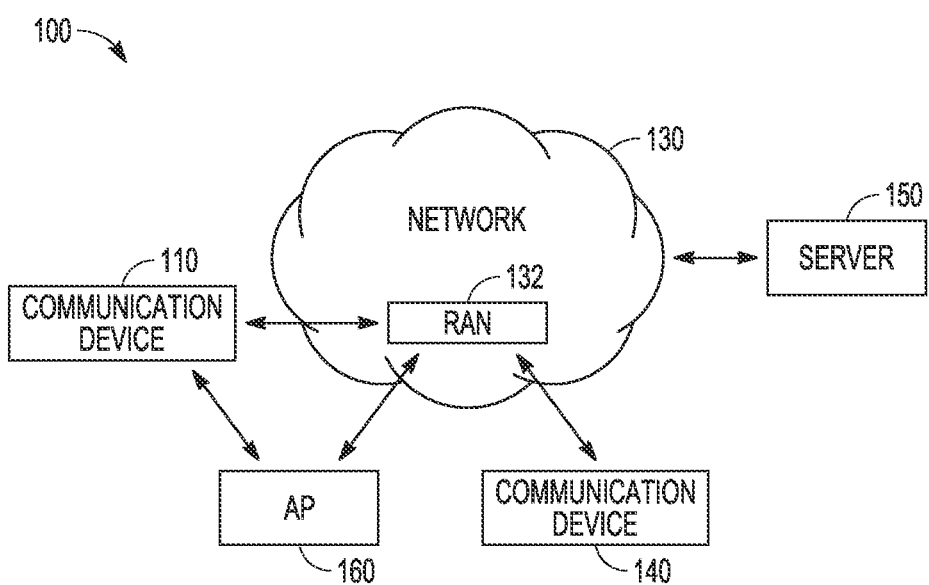
FIG. 1 is a functional block diagram illustrating a system according to some aspects.

FIG. 1 is a functional block diagram illustrating a system according to some aspects. The system 100 may include multiple communication devices 110, 140. In some aspects, one or both the communication devices 110, 140 may be communication devices that communicate with each other directly (e.g., via P2P or other short range communication protocol) or via one or more short range or long range wireless networks 130. The communication devices 110, 140 may, for example, communicate wirelessly locally, for example, via one or more random access networks (RANs) 132, WiFi access points (APs) 160 or directly using any of a number of different techniques and protocols, such as WiFi, Bluetooth, or Zigbee, among others. The RANs 132 may contain one or more base stations such as evolved NodeBs (eNBs) and $5^{th}$ generation NodeBs (gNBs) and/or micro, pico and/or nano base stations.

The communication devices 110, 140 may communicate through the network 130 via Third Generation Partnership Project Long Term Evolution (3GPP LTE) protocols and LTE advanced (LTE-A) protocols, 4G protocols or 5G protocols. Examples of communication devices 110, 140 include, but are not limited to, mobile devices such as portable handsets, smartphones, tablet computers, laptop computers, wearable devices, sensors and devices in vehicles, such as cars, trucks or aerial devices (drones). In some cases, the communication devices 110, 140 may communicate with each other and/or with one or more servers 150. The particular server(s) 150 may depend on the application used by the communication devices 110, 140.

The network 130 may contain network devices such as a gateway (e.g., a serving gateway and/or packet data network gateway), a Home Subscriber Server (HSS), a Mobility Management Entity (MME) for LTE networks or an Access and Mobility Function (AMF), User Plane Function (UPF), Session Management Function (SMF) etc., for 5G networks. The network 130 may also contain various servers that provide content or other information related to user accounts.

Figure 2:
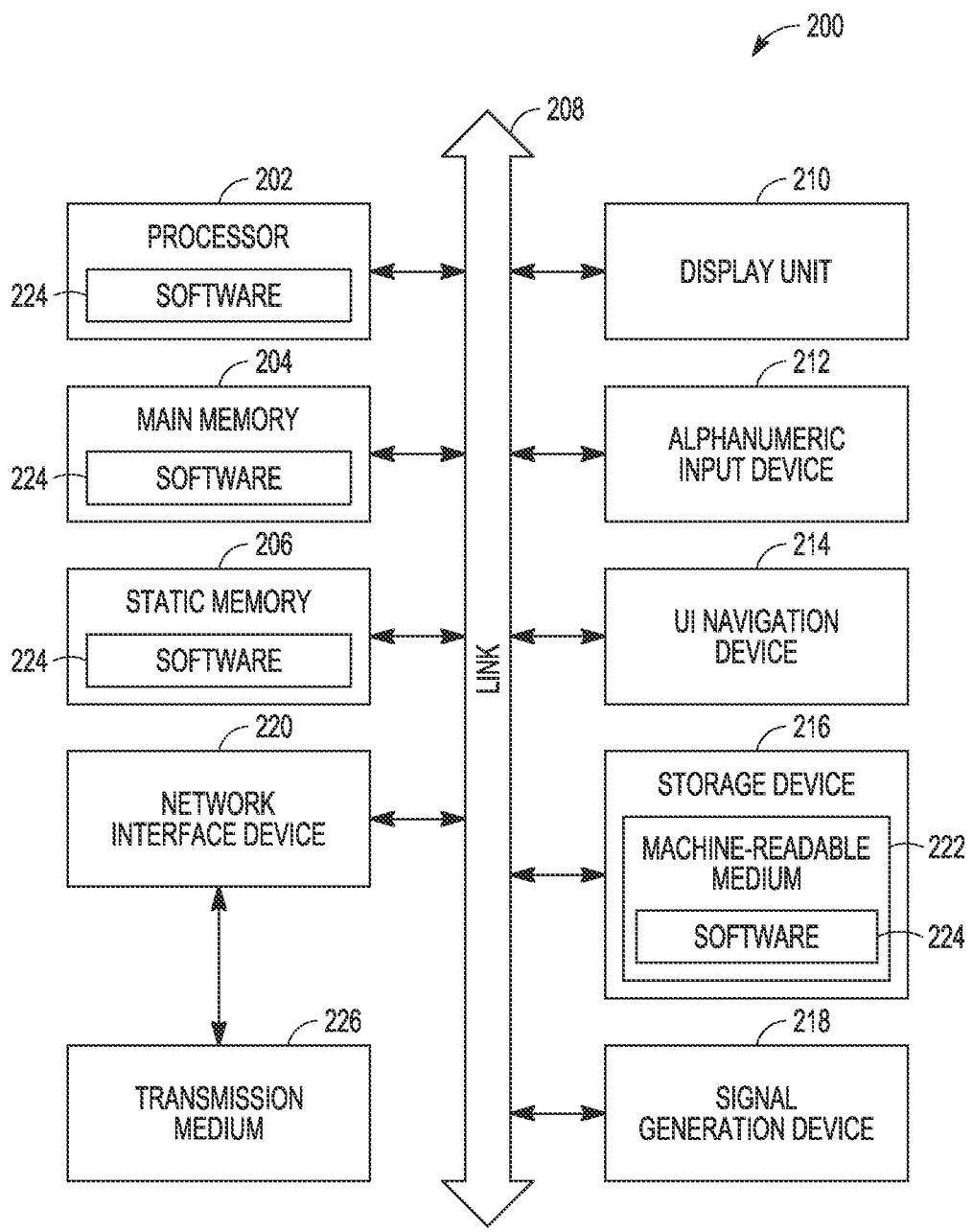
FIG. 2 illustrates a block diagram of a communication device in accordance with some aspects.

FIG. 2 illustrates a block diagram of a communication device in accordance with some embodiments. The communication device 200 may be a communication device such as a specialized computer, a personal or laptop computer (PC), a tablet PC, or a smart phone, dedicated network equipment such as an eNB, a server running software to configure the server to operate as a network device, a virtual device, or any machine capable of executing instructions (sequential or otherwise) that specify actions to be taken by that machine. For example, the communication device 200 may be implemented as one or more of the devices shown in FIG. 1. Note that communications described herein may be encoded before transmission by the transmitting entity (e.g., communication device, AP) for reception by the receiving entity (e.g., AP, communication device) and decoded after reception by the receiving entity.

Examples, as described herein, may include, or may operate on, logic or a number of components, modules, or mechanisms. Modules and components are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" (and "component") is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The communication device 200 may include a hardware processor (or equivalently processing circuitry) 202 (e.g., a central processing unit (CPU), a GPU, a hardware processor core, or any combination thereof), a main memory 204 and a static memory 206, some or all of which may communicate with each other via an interlink (e.g., bus) 208. The main memory 204 may contain any or all of removable storage and non-removable storage, volatile memory or non-volatile memory. The communication device 200 may further include a display unit 210 such as a video display, an alphanumeric input device 212 (e.g., a keyboard), and a user interface (UI) navigation device 214 (e.g., a mouse). In an example, the display unit 210, input device 212 and UI navigation device 214 may be a touch screen display. The communication device 200 may additionally include a storage device (e.g., drive unit) 216, a signal generation device 218 (e.g., a speaker), a network interface device 220, and one or more sensors, such as a global positioning system (GPS) sensor, compass, accelerometer, or other sensor. The communication device 200 may further include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 216 may include a non-transitory machine readable medium 222 (hereinafter simply referred to as machine readable medium) on which is stored one or more sets of data structures or instructions 224 (e.g., software) embodying or utilized by any one or more of the techniques or functions described herein. The instructions 224 may also reside, completely or at least partially, within the main memory 204, within static memory 206, and/or within the hardware processor 202 during execution thereof by the communication device 200. While the machine readable medium 222 is illustrated as a single medium, the term "machine readable medium" may include a single medium or multiple media (e.g., a centralized or distributed database, and/or associated caches and servers) configured to store the one or more instructions 224.

The term "machine readable medium" may include any medium that is capable of storing, encoding, or carrying instructions for execution by the communication device 200 and that cause the communication device 200 to perform any one or more of the techniques of the present disclosure, or that is capable of storing, encoding or carrying data structures used by or associated with such instructions. Non-limiting machine-readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Radio access Memory (RAM); and CD-ROM and DVD-ROM disks.

The instructions 224 may further be transmitted or received over a communications network using a transmission medium 226 via the network interface device 220 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks. Communications over the networks may include one or more different protocols, such as Institute of Electrical and Electronics Engineers (IEEE) 802.11 family of standards known as Wi-Fi, IEEE 802.16 family of standards known as WiMax, IEEE 802.15.4 family of standards, a Long Term Evolution (LTE) family of standards, a Universal Mobile Telecommunications System (UMTS) family of standards, peer-to-peer (P2P) networks, a next generation (NG)/$5^{th}$ generation (5G) standards among others. In an example, the network interface device 220 may include one or more physical jacks (e.g., Ethernet, coaxial, or phone jacks) or one or more antennas to connect to the transmission medium 226.

Note that the term "circuitry" as used herein refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" or "processor" as used herein thus refers to, is part of, or includes circuitry capable of sequentially and automatically carrying out a sequence of arithmetic or logical operations, or recording, storing, and/or transferring digital data. The term "processor circuitry" or "processor" may refer to one or more application processors, one or more baseband processors, a physical central processing unit (CPU), a single- or multi-core processor, and/or any other device capable of executing or otherwise operating computer-executable instructions, such as program code, software modules, and/or functional processes.

Devices may operate in accordance with existing IEEE 802.11, 802,11a, 802. 11b, 802.11e, 802.11g, 802.11h, 802, 11i, 802.11n, 802.11ac, 802.11ax, 802.16, 802.16d, 802.16e standards and/or future versions and/or derivatives and/or Long Term Evolution (LTE) of the above standards. Some embodiments may be used in conjunction with one or more types of wireless communication signals and/or systems, for example, Radio Frequency (RF), Infra-Red (IR), Frequency Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), Extended GPRS, Code-Division Multiple Access (CDMA), Wideband CDMA (WCDMA), CDMA 2000, Multi-Carder Modulation (MDM), Discrete Multi-Tone (DMT), Bluetooth, ZigBee, or the like.

As above, reduction of the noise figure in a receiver is desirable for wireless communication devices. At present, wireless products having best-in-class noise figure either use an external LNA and switch or an external radio frequency (RF) Front-End Module (FEM) that includes a Power Amplifier (PA), LNA and switch. Such external RF Front-End components are typically manufactured using either Silicon on Insulator (SOI) or GaAs processes, and therefore achieve better noise figure than bulk CMOS. Other techniques to reduce the noise figure and improve receiver sensitivity include Maximal Ratio Combining (MRC) or Digital Beamforming, both of which use multiple receive chains. However, external RF Front-End components add significant cost and circuit board area, and therefore are usually not acceptable in commodity or mainstream wireless products such as Wi-Fi or Bluetooth-based products, while the use of only an external LNA and switch may degrade the transmit output power. Digital Beamforming, which may be used in communication devices that communicate using millimeter wave frequencies, and MRC receivers use multiple antennas, which may also add significant platform area and cost, especially in the 2-7 GHz frequency range.

To combat this, a receiver having a split LNA may be used to reduce the noise figure. In such a receiver two (or more) LNAs may be used with a shared input matching network connected to the same (single) antenna. In this case, the noise figure of each LNA may be similar (almost identical) to that of a single LNA connected to the antenna, in some embodiments, each LNA may be connected to a separate identical quadrature down-convert mixer, followed by separate identical set of baseband filters/amplifiers for a direct conversion receiver, in some embodiments, both downconvert mixers may use the same local oscillator (LO) signal tuned to the center frequency of the desired Channel. Each baseband signal may be connected to a separate identical Analog-to-Digital Converter (ADC) and the outputs of the two ADCs may be digitally summed. Since the complex signal voltages at the input of the two ADCs are coherently summed, and the complex noise voltages at the input of the two ADCs, which are partly non-correlated are non-coherently summed, the SNR after the digital summation is higher compared to the SNR at the output of each of the two ADCs. Therefore, the noise figure and receiver sensitivity may be effectively improved, compared with that of a single path receiver.

Figure 3:
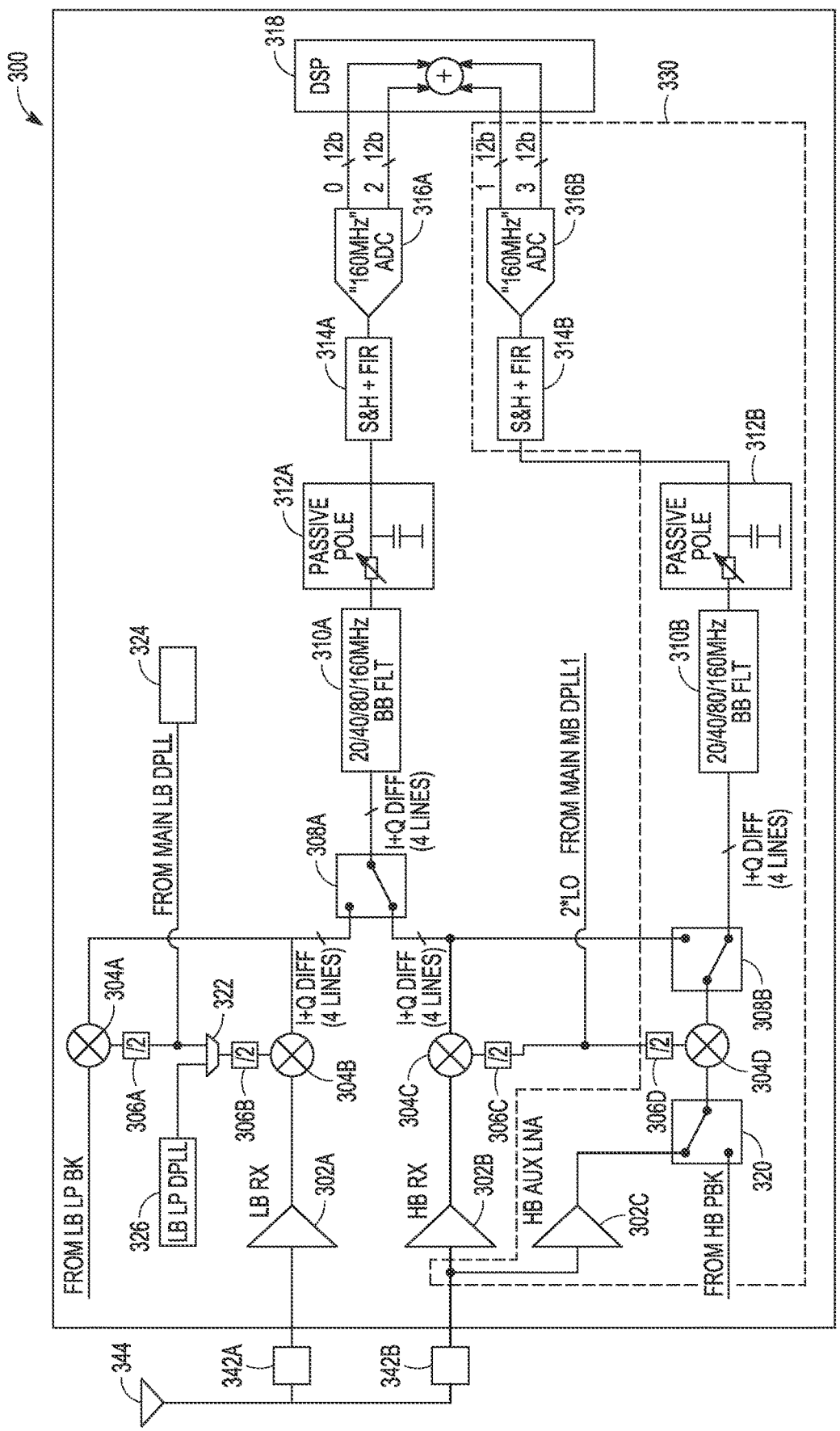
FIG. 3 illustrates a communication device in accordance with some aspects.

FIG. 3 illustrates a communication device in accordance with some aspects. Note that only some of the components of the overall device 300 are shown in FIG. 3. The components shown may be disposed or fabricated on a single chip or die. For example, although the antenna 344 and input matching networks 342a, 342b are shown, specifics of the input matching networks 342a, 342b (such as filters, isolators, and amplifiers et al.) are not shown. In addition, although only one antenna 344 is shown, in some embodiments, multiple antennas or an antenna array such as a phased array may be used for reception.

As shown, each of the input matching networks 342a, 342b is connected to a different LNA 302a, 302b, 302c in a different receiver path (either a main receiver path or an auxiliary receiver path). At least some of the receiver paths may be associated with the same input matching networks 342a, 342b, as shown. In some embodiments, one or more of the LNA 302b, 302c may thus be associated with the same input matching network 342b, while other of the LNA 302a may be associated with a unique input matching network 342a.

The LNAs 302a, 302b, 302c may be coupled to downstream components, including a mixer 304b, 304c, 304d to downconvert signals from the LNAs 302a, 302b, 302c to baseband signals for further processing. Each mixer 304b, 304c, 304d may be supplied with a LO signal from a phase lock loop (PLL), such as a digital phase lock loop (DPLL) 324. The frequency of the LO signals supplied to the mixers 304b, 304c, 304d may be different or at least some of the frequencies may be the same. As shown in FIG. 3, the LO signals may be provided from different DPLLs (a main low-band DPLL and a main high-band DPLL). In particular, the DPLLs may provide LO signals for different frequency bands (e.g., different WiFi bands such as 900 MHz, 2.4 GHz, 3.6 GHz, 4.9 GHz, 5 GHz, 5.9 GHz and 60 GHz). For convenience, only two bands are shown as being used—a high band (HB) and a low band (LB), although in other embodiments more than two frequency bands may be used when multiple individual receiver paths are present. The LB frequency band may be, for example, 2.4 GHz, while the HB frequency band may be, for example, 5 GHz. In other embodiments, the communication device containing the receiver 300 may communicate with an access point (AP) such as a base station via licensed bands (e.g., third-generation partnership project (3GPP) bands) using network resources in addition to the unlicensed (WiFi) bands, and thus the bands may be any combination of licensed and/or unlicensed bands or may be used for other frequencies, such as Bluetooth communications. Accordingly, the different receiver paths (or chains) will be referred to herein for convenience as a main receiver path, which is associated with the main LB and HB LNA signals, and an auxiliary receiver path 330 that is associated with the auxiliary LNA signals. The main and auxiliary receiver paths are described in more detail below. Note that in some embodiments, another LNA may be used for the LB to form another auxiliary receiver path.

In some embodiments, the LO signals from the DPLLs 324, 326 may be supplied directly to the mixers 304a, 304b,

304c, 304d. In other embodiments, such as that shown in FIG. 3, the LO signals from the DPLLs 324, 326 may be at a higher frequency than desired to be applied to the mixers 304a, 304b, 304c, 304d. In this case, dividers 306a, 306b, 306c, 306d may be used to convert the LO signals from the DPLLs 324, 326 to 1,0 signals to be provided to the mixers 304a, 304b, 304c, 304d. In particular, in the embodiments shown, the LO signals from the DPLLs 324, 326 may be twice the LO frequency desired to be applied to the mixers 304a, 304b, 304c, 304d and the dividers 306a, 306b, 306c, 306d are ½ dividers that thus provide an LO signal at half the frequency of the LO signals from the DPLLs 324, 326.

Note that one of the mixers (as shown, LPBK mixer 304a to which the LO signal from the main LB DPLL 324 is provided through the LPBK divider 306a) may be used to supply a loopback signal for a transmitter calibration test of the receiver system using a LB LPBK signal supplied to the LPBK mixer 304a. Similarly, calibration switch 320 may be used to supply a loopback signal for a transmitter calibration test of the receiver system using a HB LPBK signal supplied to the auxiliary mixer 304d and auxiliary switch 308b. This permits auxiliary mixer 304d to be used both as a test capacity and as part of the noise figure improvement scheme described using the auxiliary LNA 302c. The calibration switch 320 may be coupled with the auxiliary switch 308b to ensure that the HB LPBK signal (the calibration signal) is supplied to the main receiver path through auxiliary switch 308b and main switch 308a. In other embodiments, the calibration switch 320 may be independent of the auxiliary switch 308b so that the auxiliary receiver path may be calibrated in addition to the main receiver path. In addition, a multiplexer 322 (or other selector) may be used to provide the LO signal either from the main LB DPLL 324 or from a LB low power (LP) DPLL 326 to the corresponding divider 306b associated with the mixer 304b of the LB receiver path.

The downconverted signals from mixers 304b, 304c, 304d may be provided to baseband filters 310a, 310b via switches 308a, 308b. One of the switches (main switch 308a) may be used to select which of the downconverted signals from the LB LNA 302a or HB LNA 302b is to be provided for filtering by the main baseband filter 310a in the main receiver path. The other switch (auxiliary switch 308b) may be used to select whether downconverted signals from the auxiliary LNA 302c is supplied for filtering by the auxiliary baseband filter 310b in the auxiliary receiver path. The main switch 308a and the auxiliary switch 308b may be coupled so that signals from the HB LNA 302b and the auxiliary LNA 302c are both respectively supplied to the main baseband filter 310a and the auxiliary baseband filter 310b or neither are respectively supplied to the main baseband filter 310a and the auxiliary baseband filter 310b.

The calibration switch 320 may be disposed in the auxiliary band path between the auxiliary LNA 302c and the auxiliary mixer 304d. The calibration switch 320 may be used to supply a HB LPBK signal to the auxiliary mixer 304d for another test of the receiver system during transmitter calibration rather than supplying the auxiliary LNA 302c signal to the auxiliary mixer 304d.

The main baseband filter 310a and the auxiliary baseband filter 310b may each have a predetermined bandwidth. The bandwidth of both the main baseband filter 310a and the auxiliary baseband filter 310b may be selectable between $2^n * 20$ MHz, where n=0, 1, 2 or 3. The bandwidths of both the main baseband filter 310a and the auxiliary baseband filter 310b may be the same. Thus, as the signals provided from the main baseband filter 310a and the auxiliary baseband filter 310b may be bandpass limited around the baseband. However, to further reduce spurious high frequency signals from the main baseband filter 310a and the auxiliary baseband filter 310b, a main passive pole 312a and auxiliary passive pole 312b may be used to eliminate such signals. Each of the main passive pole 312a and auxiliary passive pole 312b may be formed from an RC circuit, with a variable resistor in series with the main passive pole 312a and auxiliary passive pole 312b and a capacitor to ground coupled with the variable resistor. Of course, in other embodiments more complex circuits may be used to filter out any signals outside of the selected bandwidth of the main baseband filter 310a and the auxiliary baseband filter 310b.

The signals from the main passive pole 312a and auxiliary passive pole 312b may be respectively supplied to main sample-and-hold (S&H) and finite impulse response (FIR) filter circuitry 314a and auxiliary S&H and FIR filter circuitry 314b. The S&H circuit samples the voltage from the main passive pole 312a and auxiliary passive pole 312b and holds that value for a predetermined amount of time. The FIR filter filters out switching transients caused by the S&H circuit while providing the output value.

The output from the main S&H and FIR filter circuitry 314a and auxiliary S&H and FIR filter circuitry 314b may be respectively supplied to a main ADC 316a and auxiliary ADC 316b. The main ADC 316a and auxiliary ADC 316b may have a bandwidth matched to that of the main baseband filter 310a and the auxiliary baseband filter 310b or may have a bandwidth of the maximum selectable bandwidth of the main baseband filter 310a and the auxiliary baseband filter 310b. The output from each of the main ADC 316a and auxiliary ADC 316b may include 12 bits for each of the complex (i.e., each of the I and Q) signals; thus each of the main ADC 316a and auxiliary ADC 316b may provide 2 12 bit digital signals as an output, as shown in FIG. 3. The components of the main receiver path (main electronic components—302b→ADC 316a) and the components of the auxiliary receiver path (auxiliary electronic components—LNA 302c→ADC 316b) may be matched such that the characteristics of the main electronic components are matched with the characteristics of the corresponding auxiliary electronic components.

The main ADC 316a and auxiliary ADC 316b convert the complex analog signals into digital signals for further processing by a processor, such as a digital signal processor (DSP) 318. The DSP 318 may contain a coherent combiner that coherently combines (or summer that sums) the complex main and auxiliary digital voltage values (the digital I signal of each of the main and auxiliary digital voltages may be summed and the digital Q signal of each of the main and auxiliary digital voltages may be summed) to produce a single digital voltage value. Digital summation at the ADC outputs may add one bit in the digital path without compromising the receiver/ADC dynamic range. This may effectively double the signal level at the output, effectively implementing a 6 dB higher gain with the same input referred linearity.

Note that each of the main and auxiliary receiver paths is associated with a signal path for both differential I (Ip and In) and Q (Qp and Qn) signals, which are also referred to merely as I and Q signals or complex signals. Although each receiver path (main or auxiliary) has 4 physical signal lines, for convenience, only a single receiver path for each receiver path is shown in FIG. 3. Similarly, although only one baseband filters 310a, 310b, passive pole 312a, 312b, S&H+FIR 314a, 314b and ADC 316a, 316b is shown for each of the main and auxiliary receiver paths, these components are replicated for each complex signal pair (i.e., one for the I signals along each receiver path and one for the Q signals along each receiver path). Nor are the mixers or phase shifters to form the complex signals shown for convenience.

As above, since the inputs of the main LNA 302b and the auxiliary LNA 302c are tied to the same input matching network 342b, the shared input matching network converts the received signal power to a voltage that appears across the inputs of both LNAs, without introducing any power splitting loss. Moreover, the signals of the input matching network 342b that are supplied to the DSP 318 as digital signals may be correlated and thus add coherently. However, as the noise introduced by the main LNA 302b and the auxiliary LNA 302c may mostly be non-correlated and thus may sum non-coherently. As a consequence, the SNR of the summed signal may be increased with relation to the SNR of the signal from the main LNA 302b and the auxiliary LNA 302c. That is, the (complex) signal voltages introduced to the main ADC 316a and auxiliary ADC 316b are coherently summed, and the (complex) noise voltages introduced to the main ADC 316a and auxiliary ADC 316b are partly non-correlated and thus are non-coherently summed. Simulations show an improvement of the noise figure of the receiver by about 1 dB relative to a baseline receiver that does not use an auxiliary receiver path (after exhausting/optimizing the LNA current consumption for best noise figure vs. linearity), while still using a fully integrated CMOS implementation. This can match the performance of systems that use an external SOI/GaAs RF front end, but at a much lower cost and smaller area.

The receiver 300 can be operated in either single path mode, in which the auxiliary path is not used, or in dual path mode, using the auxiliary path. The single path mode may be selected if a lower power is desired and a moderate noise figure is acceptable. The dual path mode may be selected if power is less desired than an improve noise figure and extended link range. Although not shown, more than one auxiliary receiver path (including auxiliary LNA) may be coupled with the same input matching network. Increasing the number of auxiliary receiver paths may engender the above tradeoffs, i.e., increasing the power consumption and area to reduce the noise figure. If more than one auxiliary receiver path is used, only one calibration switch 320 may still be present, however. Similarly, all of the auxiliary switches (308b) may be actuated by the same signal.

In reality however, some of the noise introduced by the main LNA 302b and the auxiliary LNA 302c are correlated. This may compromise the noise figure improvement as the correlated noise thus may be summed coherently. The actual noise figure improvement eventually depends on the ratio between correlated vs. non-correlated noises between the two LNAs in the split LNA.

Figure 4A:
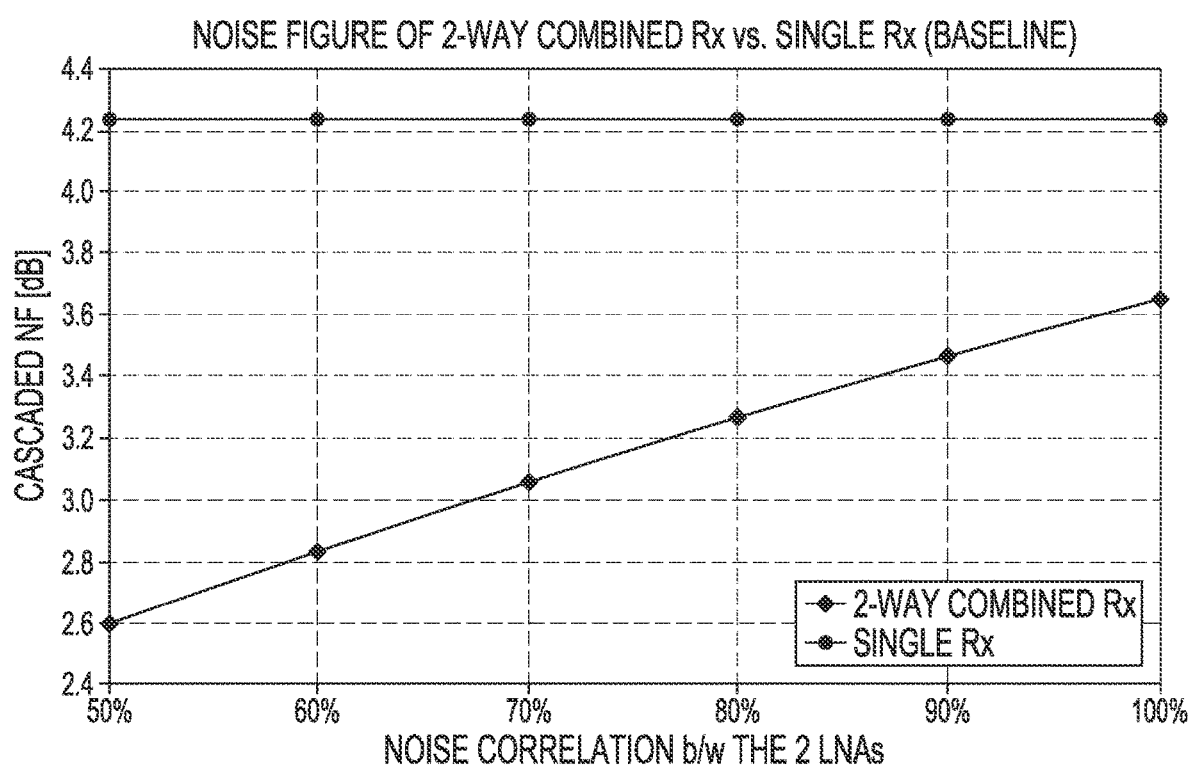
FIG. 4A illustrates a simulated noise figure in accordance with some aspects.

An example of noise figure calculation for a combined receiver chain compared with single receiver chain, as a function of the noise correlation (%) between the main LNA 302b and the auxiliary LNA 302c is shown in Table 1. FIG. 4A illustrates a simulated noise figure in accordance with some aspects.

TABLE 1

Noise Figure of combined Rx chain vs. noise correlation

| | Single Rx chain [dB] | | | | | | | | | | |
|---|---|---|---|---|---|---|---|---|---|---|---|
| LANA NF @ max gain | 3 | 3 | 3 | 3 | 3 | 3 | 3 | 3 | 3 | 3 | 3 |
| LNA + TIA max gain | 42 | 42 | 42 | 42 | 42 | 42 | 42 | 42 | 42 | 42 | 42 |
| TIA + Filter + ADC "NF" | 19.18 | 19.18 | 19.18 | 19.18 | 19.18 | 19.18 | 19.18 | 19.18 | 19.18 | 19.18 | 19.18 |
| Rx cascaded NF @ max gain | 4.2 | 4.2 | 4.2 | 4.2 | 4.2 | 4.2 | 4.2 | 4.2 | 4.2 | 4.2 | 4.2 |
| | Combining @ ADC output [dB] | | | | | | | | | | |
| LNA to LNA correlated noise | 0% | 10% | 20% | 30% | 40% | 50% | 60% | 70% | 80% | 90% | 100% |
| LNF NF @ max gain | 3 | 3 | 3 | 3 | 3 | 3 | 3 | 3 | 3 | 3 | 3 |
| LNA + TIA max gain | 42 | 42 | 42 | 42 | 42 | 42 | 42 | 42 | 42 | 42 | 42 |
| TIA + filter + ADC "NF" | 19.18 | 19.18 | 19.18 | 19.18 | 19.18 | 19.18 | 19.18 | 19.18 | 19.18 | 19.18 | 19.18 |
| Combined Rx cascaded NF @ max gain | 1.22 | 1.53 | 1.83 | 2.10 | 2.36 | 2.60 | 2.84 | 3.06 | 3.27 | 3.46 | 3.66 |
| NF Improvement | 3.01 | 2.69 | 2.40 | 2.12 | 1.87 | 1.62 | 1.39 | 1.17 | 0.96 | 0.76 | 0.57 |

As can be seen in Table 1, in the ideal case of 0% correlated noise between the main LNA 302b and the auxiliary LNA 302c, the noise figure is improved by 3 dB (from 4.2 dB to 1.2 dB), for 100% correlated noise between the main LNA 302b and the auxiliary LNA 302c, the noise figure is still improved by 0.57 dB, thanks to effective reduction of non-correlated noise contribution of the succeeding stages, i.e., Trans-Impedance Amplifier (TIA), main baseband filter 310a and auxiliary baseband filter 310b and main ADC 316a and auxiliary ADC 316b. The TIA may be the first stage (input stage) of the baseband filter, which may contain two or more stages in which the first stage may be implemented as a TIA, while the second stage may be implemented as a voltage amplifier (as shown in more detail in relation to FIG. 5, below). FIG. 4A illustrates the simulated noise figure for the combined Rx chain vs. the single Rx chain implemented in Table 1, for 50%-100% correlation between the noise introduced by the main LNA 302b and the auxiliary LNA 302c. As seen in the simulation of FIG. 4A, the noise figure improvement essentially decreases linearly with increasing correlation to reach the above minimum improvement at 100% correlation.

Figure 4B:
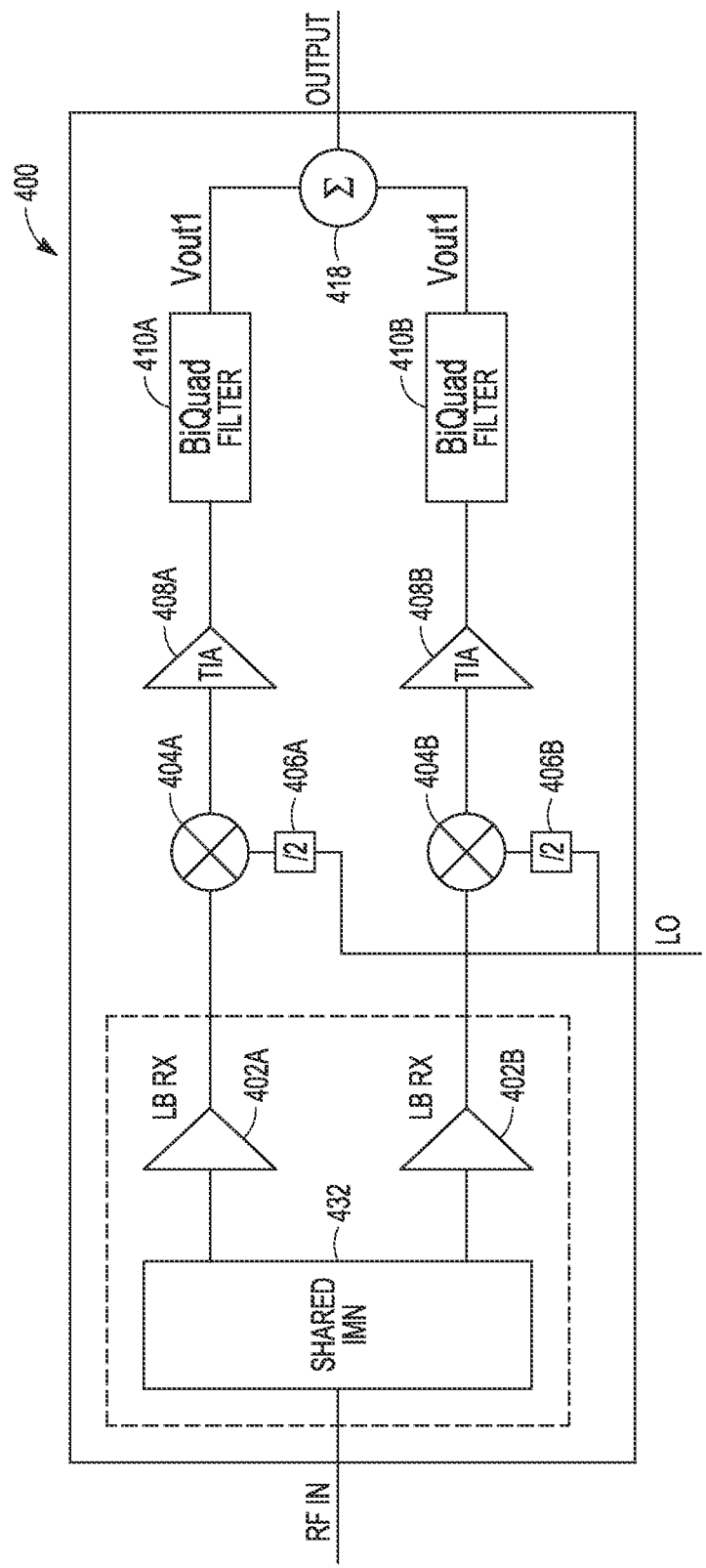
FIG. 4B illustrates a simulated Bluetooth receiver in accordance with some aspects.

The noise figure improvement technique described above was also simulated for a 2.4 GHz Bluetooth receiver line-up in 16FF CMOS design. FIG. 4B illustrates a simulated Bluetooth receiver in accordance with some aspects. As shown, the simulation includes a shared input matching network 432 that provides signals to split LNAs 402a, 402b. The LNAs 402a, 402b may also be designed for Bluetooth frequencies. The LNAs 402a, 402b may be connected to duplicated receive paths that include a downconvert mixer 404a, 404b, a TIA 408a, 408b and a BiQuad filter 410a, 410b. The outputs of the BiQuad filters 410a, 410b are supplied to a summer 418. The same LO signal is provided to dividers 406a, 406b to halve the frequency of the LO signal before being supplied to the downconvert mixers 404a, 404b. In this case, for simulation simplicity reasons, the receiver 400 did not include the ADC and the summation was done in the analog domain. Table 2 below shows the numerical noise figure comparison between a single Rx chain and combined Rx chain for the Bluetooth receiver of FIG. 4B.

TABLE 2

Noise Figure of combined Rx chain vs. noise correlation for BT receiver

Single Rx noise model based on circuit simulation [dB]

LB VG

| | | | | | | | | | | | |
|---|---|---|---|---|---|---|---|---|---|---|---|
| LANA NF @ max gain | 2.5 | 2.5 | 2.5 | 2.5 | 2.5 | 2.5 | 2.5 | 2.5 | 2.5 | 2.5 | 2.5 |
| LNA + TIA max gain | 54 | 54 | 54 | 54 | 54 | 54 | 54 | 54 | 54 | 54 | 54 |
| TIA + BiQuad (excluding ADC) | 18.11 | 18.11 | 18.11 | 18.11 | 18.11 | 18.11 | 18.11 | 18.11 | 18.11 | 18.11 | 18.11 |
| Rx cascaded NF @ max gain | 2.8 | 2.8 | 2.8 | 2.8 | 2.8 | 2.8 | 2.8 | 2.8 | 2.8 | 2.8 | 2.8 |

Combining @ BiQuad output, based on circuit simulation [dB]

| | | | | | | | | | | | |
|---|---|---|---|---|---|---|---|---|---|---|---|
| LNA to LNA correlated noise | 60% | 62% | 64% | 66% | 68% | 70% | 72% | 74% | 76% | 78% | 80% |
| LNA NF @ max gain | 2.5 | 2.5 | 2.5 | 2.5 | 2.5 | 2.5 | 2.5 | 2.5 | 2.5 | 2.5 | 2.5 |
| LNA + TIA max gain | 54 | 54 | 54 | 54 | 54 | 54 | 54 | 54 | 54 | 54 | 54 |
| TIA + BiQuad (excluding ADC) | 18.11 | 18.11 | 18.11 | 18.11 | 18.11 | 18.11 | 18.11 | 18.11 | 18.11 | 18.11 | 18.11 |
| Combined Rx cascaded NF @ max gain | 1.72 | 1.77 | 1.82 | 1.87 | 1.92 | 1.97 | 2.02 | 2.07 | 2.12 | 2.16 | 2.21 |
| NF Improvement | 1.08 | 1.03 | 0.98 | 0.93 | 0.88 | 0.83 | 0.78 | 0.73 | 0.68 | 0.64 | 0.59 |

The simulation results for a single Rx chain indicated a 54 dB gain and 2.8 dB noise FIG. (2.5 dB contributed by the LNA and mixer). On the other hand, for the combined receiver chain the simulation results indicated a 60 dB gain (that is, 6 dB higher gain compared with the single Rx chain, as expected) and 1.9 dB noise figure, i.e., 0.9 dB improvement in noise figure over the single Rx chain. Back fitting the simulation results to the noise figure model, the LNA noise are 68% correlated as shown in Table 2, resulting in a 0.9 dB noise figure improvement, excluding the ADC contribution.

A mathematical description of the noise figure improvement technique is described below.

"Shared LNA": a duplicated LNA with shared input matching network, characterized by voltage-in to current-out trans-admittance gain $G_1$ and self-generated output noise current $i_{n1}$.

$in_{11c}$ and $in_{21c}$ are the self-generated correlated noise currents at the two output ports of the "shared LNA" when the LNAs inputs are terminated.

$in_{11nc}$ and $in_{21nc}$ are the self-generated non-correlated noise currents at the two output ports of the "shared LNA" when the LNAs inputs are terminated.

$$in_{11} = \sqrt{(in_{11c}^2 + n_{11nc}^2)}$$

$$in_{21} = \sqrt{(in_{21c}^2 + in_{21nc}^2)}$$

Mixer: current-in to current-out mixer, assumed noiseless and unity gain (for simplicity).

TIA: a Trans-Impedance Amplifier, characterized by current-in to voltage-out gain $G_2$.

$v_{n12}$ and $v_{n22}$ are the self generated non-correlated noise voltages at the two output ports of the TIAs when the TIAs inputs are terminated.

Filter+ADC $v_{n13}$ and $v_{n23}$ are the self-generated non-correlated noise voltages at the two output ports of the filter (+ADC) when the inputs of the filters are terminated.

Looking at the (LNA+Mixer+TIA) as an "atomic" voltage-in to voltage-out amplifier, the cascaded noise voltages at the two output ports of the TIAs are given by:

$$V_{cn12}^2 = i_{n11c}^2 \cdot G_2^2 + i_{n11nc}^2 \cdot G_2^2 + v_{n12}^2$$

$$V_{cn22}^2 = i_{n21c}^2 \cdot G_2^2 + i_{n21nc}^2 \cdot G_2^2 + v_{n22}^2$$

The sum of the outputs of the two filters (+ADCs) can be express the total noise as:

$$V_{cn3}^2 = [(i_{n11c} + i_{n21c})^2 \cdot G_2^2 + i_{n11nc}^2 \cdot G_2^2 + i_{n21nc}^2 \cdot G_2^2 + v_{n12}^2 + v_{n22}^2] \cdot G_3^2 + v_{n13}^2 + v_{n23}^2$$

From symmetry considerations, if the same noise magnitudes for both Rx chains is assumed, i.e.:

$$in_{11c} = i_{n21c} = i_{n1c}, in_{11nc} = i_{n21nc} = i_{n1nc}, v_{n12} = v_{n22} = v_{n2},$$
$$v_{n13} = v_{n23} = v_{n3}$$

This results in:

$$V_{cn3}^2 = (4 \cdot i_{n1c}^2 \cdot G_2^2 + 2 \cdot i_{n1nc}^2 \cdot G_2^2 + 2 \cdot v_{n2}^2) \cdot G_3^2 + 2 \cdot v_{v3}^2$$

While for single chain Rx:

$$V_{cn3}^2 = (i_{n1c}^2 \cdot G_2^2 + i_{n1nc}^2 \cdot G_2^2 + v_{n2}^2) \cdot G_3^2 + v_{n3}^2$$

The SNR at the outputs of the single Rx chain is given by:

$$SNR_3 = (V_s \cdot G_1 \cdot G_2 \cdot G_3)^2 / V_{cn3}^2 = (V_s^2 \cdot G_1^2 \cdot G_2^2 \cdot G_3^2) / [(i_{n1c}^2 \cdot G_2^2 + i_{n1nc}^2 \cdot G_2^2 + v_{n2}^2) \cdot G_3^2 + v_{n3}^2]$$

Assuming the signal voltages at the outputs of the two Rx chains are summed coherently, the SNR at the output of the combined Rx chains is given by:

$$SNR_{cr3}=(2\cdot V_s\cdot G_1\cdot G_2\cdot G_3)^2/V_{en3}^2=(4\cdot V_s^2\cdot G_1^2\cdot G_2^2\cdot G_3^2)/$$
$$[(4\cdot i_{n1c}^2\cdot G_2^2+i_{n1nc}^2\cdot G_2^2\cdot 2\cdot v_{n2}^2)\cdot G_3^2+2\cdot v_{n3}^2]$$

Ideally, if there was no correlated noise in the "shared LNA", the SNR is given as:

$$SNR_{cr3}=(2\cdot V_s\cdot G_1\cdot G_2+G_3)^2/V_{en3}^2=(4\cdot V_s^2\cdot G_1^2\cdot G_2^2\cdot G_3^2)/$$
$$[(2\cdot i_{n1nc}^2\cdot G_2^2+2\cdot v_{n2}^2)\cdot G_3^2+2\cdot v_{n3}^2]=2\cdot SNR_3$$

As indicated, a 3 dB improvement in SNR, which is the upper bound for the combined Rx.

Figure 5:
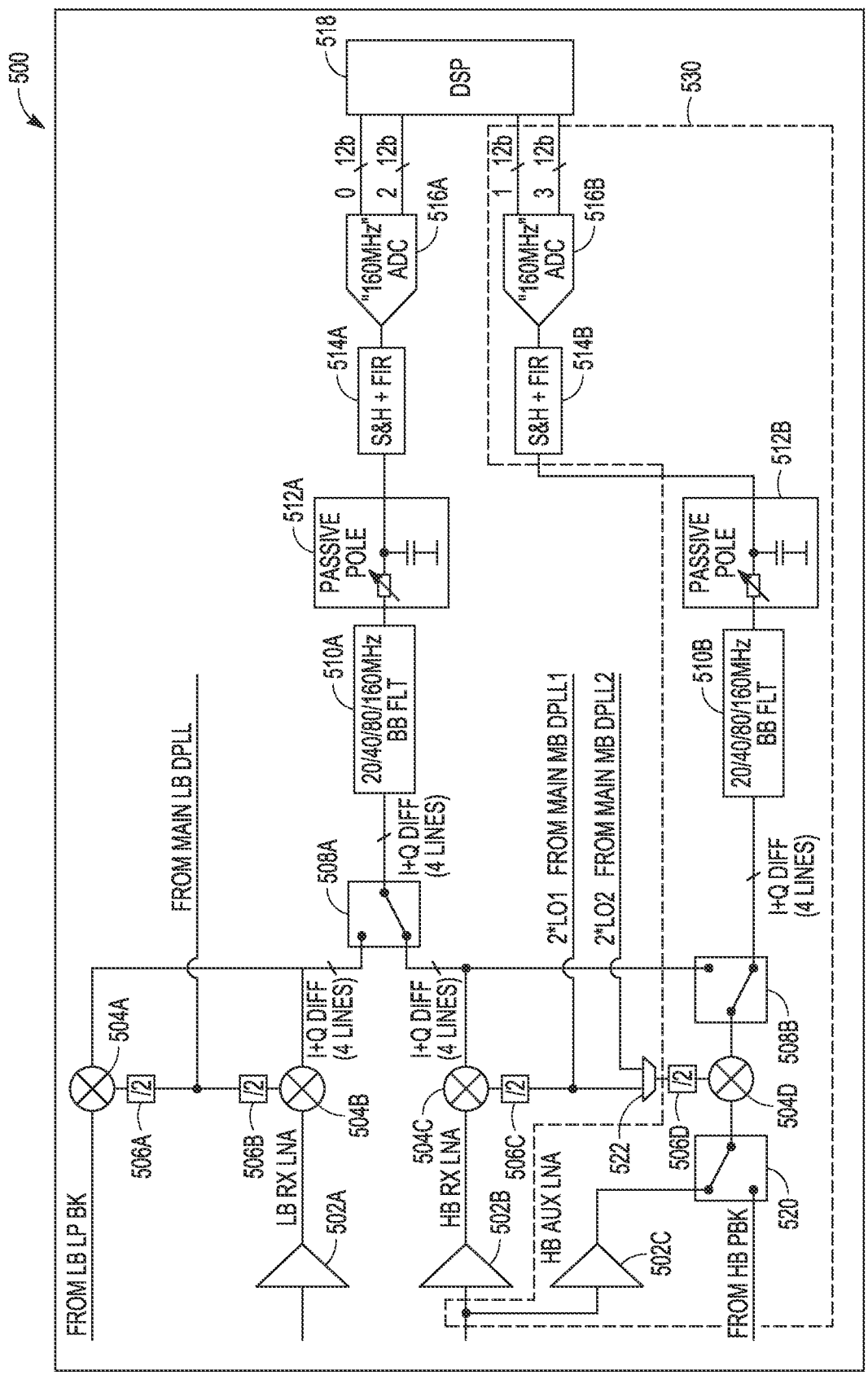
FIG. 5 illustrates a receiver in accordance with some aspects.

While reduction of the noise figure is one reason to add an auxiliary receiver chain, another embodiment of a combined receiver chain may be used to increase the bandwidth reception. FIG. 5 illustrates another receiver in accordance with some aspects. As shown in FIG. 5, the dual path receiver can be reused for doubling the maximum channel bandwidth, using the duplicated baseband filter 510a, 510b and ADC 516a, 516b. For example, the receiver 500 may be used to support 320 MHz in 6-7 GHz WiFi band as 160+160 MHz, while improving the receiver dynamic range and SNR.

The antenna and input matching networks are similar to those of FIG. 3 and thus not shown for convenience. The main LB LNA 502a is coupled with a different input matching networks than the main HB LNA 502b and auxiliary LNA 502c, which are coupled with the same input matching network.

The main LB LNA 502a, main HB LNA 502b, and auxiliary LNA 502c may be respectfully coupled with a main LB mixer 504b, main HB mixer 504c, and auxiliary mixer 504d to downconvert signals to baseband signals for further processing. Each of the main LB mixer 504b, main HB mixer 504c and auxiliary mixer 504d may be supplied with LO signal from a different DPLL whose frequency has been halved respectively by a main divider 506b, main HB divider 506c, and auxiliary divider 506d. LPBK mixer 304a to which the LO signal from the LB DPLL is provided through the LPBK divider 306a may be used to supply a loopback signal for a transmitter calibration test of the receiver system using a LB LPBK signal supplied to the LPBK mixer 304a.

Unlike the arrangement of FIG. 3, in FIG. 5 a multiplexer 522 may be used select whether to provide the LO signal from a first main HB DPLL (HB DPLL1) or from a second main HB DPLL (HB DPLL2) to the divider 506d associated with the auxiliary mixer 504d of the auxiliary receiver path 530. The frequencies of the first main HB DPLL and second main HB DPLL may be selected such that the bandwidths of the downconverted signals from the main HB LNA 502b and auxiliary LNA 502c are contiguous or the bandwidths may be non-contiguous. The use of the multiplexer 522 also permits the same main HB DPLL signal (HB DPLL1) to be supplied to both the main HB mixer 504c and auxiliary mixer 504d, thereby allowing the receiver 500 to be used to reduce the noise figure in a manner similar to the receiver 300 shown in FIG. 3.

The downconverted signals from main HB mixer 504c and auxiliary mixer 504d may be provided to baseband filters 510a, 510b respectively via main switch 508a and auxiliary switch 508b. The main switch 508a and the auxiliary switch 508b may be coupled so that signals from the HB LNA 502b and the auxiliary LNA 502c are both respectively supplied to the main baseband filter 510a and the auxiliary baseband filter 510b or neither are respectively supplied to the main baseband filter 510a and the auxiliary baseband filter 510b. A test switch 520 may be disposed in the auxiliary band path between the auxiliary LNA 502c and the auxiliary mixer 504d.

The main baseband filter 510a and the auxiliary baseband filter 510b may each have a predetermined bandwidth. The bandwidth of both the main baseband filter 510a and the auxiliary baseband filter 510b may be selectable between $2^n*20$ MHz, where n=0, 1, 2 or 3. The bandwidths of both the main baseband filter 510a and the auxiliary baseband filter 510b may be the same. A main passive pole 512a and auxiliary passive pole 512b may be used effect a lowpass filter for signals respectfully from the main baseband filter 510a and the auxiliary baseband filter 510b.

The signals from the main passive pole 512a and auxiliary passive pole 512b may be respectively supplied to main S&H and FIR filter circuitry 514a and auxiliary S&H and FIR filter circuitry 514b. The output from the main S&H and FIR filter circuitry 514a and auxiliary S&H and FIR filter circuitry 514b may be respectively supplied to a main ADC 516a and auxiliary ADC 516b. The main ADC 516a and auxiliary ADC 516b may have a bandwidth matched to that of the main baseband filter 510a and the auxiliary baseband filter 510b or may have a bandwidth of the maximum selectable bandwidth of the main baseband filter 510a and the auxiliary baseband filter 510b. The main ADC 516a and auxiliary ADC 516b convert the signals into digital signals for further processing by the DSP 518. Rather than summing the signals from the main HB LNA 502b and auxiliary LNA 502c to reduce the noise figure when the LO signal from the first HB DPLL is selected by the multiplexer 522, when the LO signal from the second HB DPLL is selected by the multiplexer 522 the DSP 518 may thus combine the signals to provide an output having a bandwidth double that of the single Rx chain (either contiguous or non-contiguous bandwidths since the LO signals from the different HB DPLLs may be independently selected).

Figure 6:
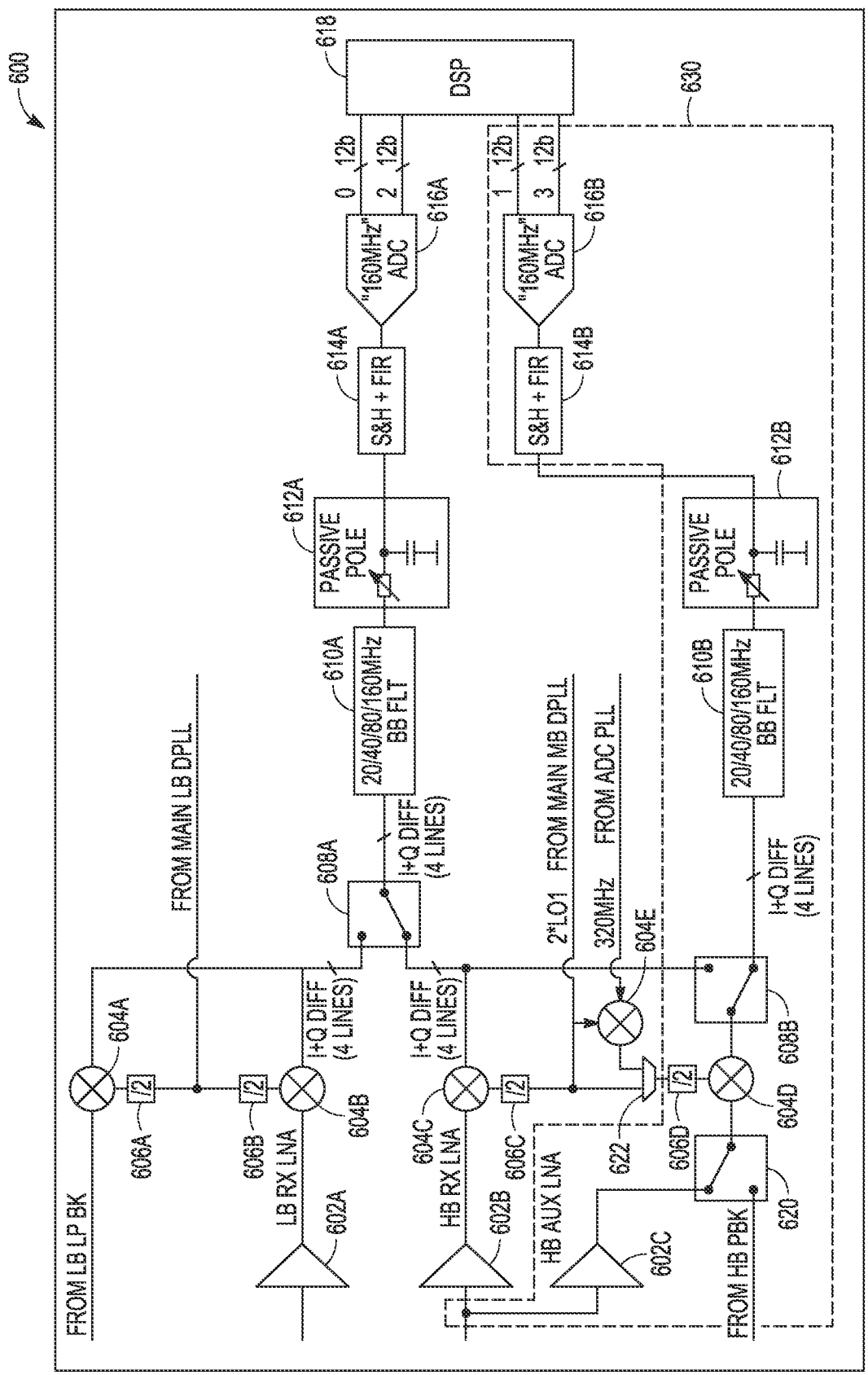
FIG. 6 illustrates another receiver in accordance with some aspects.

FIG. 6 illustrates another receiver in accordance with some aspects. FIG. 6 shows an arrangement similar to that of FIG. 5. As in FIG. 5, t antenna and input matching networks are similar to those of FIG. 3 and thus not shown for convenience in FIG. 6. The main LB LNA 602a is coupled with a different input matching networks than the main HB LNA 602b and auxiliary LNA 602c, which are coupled with the same input matching network.

The main LB LNA 602a, main HB LNA 602b, and auxiliary LNA 602c may be respectfully coupled with a main LB mixer 604b, main HB mixer 604c, and auxiliary mixer 604d to downconvert signals to baseband signals for further processing. Each of the main LB mixer 604b, main HB mixer 604c and auxiliary mixer 604d may be supplied with LO signal from a different DPLL whose frequency has been halved respectively by a main divider 606b, main HB divider 606c, and auxiliary divider 606d. LPBK mixer 304a to which the LO signal from the LB DPLL is provided through the LPBK divider 306a may be used to supply a loopback signal for a transmitter calibration test of the receiver system using a LB LPBK signal supplied to the LPBK mixer 304a.

Unlike the arrangement of FIG. 3, in FIG. 6 a multiplexer 622 may be used select whether to provide the LO signal from a main HB DPLL or from a modified LO signal to the divider 606d associated with the mixer 604d of the auxiliary receiver path 630. In particular, the LO signal from the main HB DPLL may be supplied to another mixer 604e along with a 320 MHz signal from an ADC sampling clock PLL to create the modified LO signal (whose frequency is offset by 320 MHz from the LO signal), which is then applied to the ½ divider 606d to create a modified LO signal for the auxiliary HB mixer 604d, whose frequency is offset by 160 MHz from the LO signal for the main HB mixer 604c. The use of the multiplexer 622 also permits the same main HB DPLL signal (HB DPLL1) to be supplied to both the main HB mixer 604c and auxiliary mixer 604d, thereby allowing the receiver 600 to be used to reduce the noise figure in a manner similar to the receiver 300 shown in FIG. 3.

The downconverted signals from main HB mixer 604c and auxiliary mixer 604d may be provided to baseband filters 610a, 610b respectively via main switch 608a and auxiliary switch 608b. The main switch 608a and the auxiliary switch 608b may be coupled so that signals from the HB LNA 602b and the auxiliary LNA 602c are both respectively supplied to the main baseband filter 610a and the auxiliary baseband filter 610b or neither are respectively supplied to the main baseband filter 610a and the auxiliary baseband filter 610b. A test switch 620 may be disposed in the auxiliary band path between the auxiliary LNA 602c and the auxiliary mixer 604d.

The main baseband filter 610a and the auxiliary baseband filter 610b may each have a predetermined bandwidth. The bandwidth of both the main baseband filter 610a and the auxiliary baseband filter 610b may be selectable between $2^n*20$ MHz, where n=0, 1, 2 or 3. The bandwidths of both the main baseband filter 610a and the auxiliary baseband filter 610b may be the same. A main passive pole 612a and auxiliary passive pole 612b may be used effect a lowpass filter for signals respectfully from the main baseband filter 610a and the auxiliary baseband filter 610b.

The signals from the main passive pole 612a and auxiliary passive pole 612b may be respectively supplied to main S&H and FIR filter circuitry 614a and auxiliary S&H and FIR filter circuitry 614b. The output from the main S&H and FIR filter circuitry 614a and auxiliary S&H and FIR filter circuitry 614b may be respectively supplied to a main ADC 616a and auxiliary ADC 616b. The main ADC 616a and auxiliary ADC 616b may have a bandwidth matched to that of the main baseband filter 610a and the auxiliary baseband filter 610b or may have a bandwidth of the maximum selectable bandwidth of the main baseband filter 610a and the auxiliary baseband filter 610b. The main ADC 616a and auxiliary ADC 616b convert the signals into digital signals for further processing by the DSP 618. Rather than summing the signals from the main HB LNA 602b and auxiliary LNA 602c to reduce the noise figure when the LO signal is selected by the multiplexer 622, when the modified LO signal is selected by the multiplexer 622 the DSP 618 may thus combine the signals to provide an output having a bandwidth double that of the single Rx chain (in this case contiguous since the LO signals are linked and separated by 160 MHz due to the offset mixer).

EXAMPLES

Example 1 is a receiver comprising: a main receiver path having a main low noise amplifier (LNA) and a plurality of main electronic components downstream of the main LNA, the main LNA coupled to an output of an input matching network configured to receive input signals received at an antenna; an auxiliary receiver path having an auxiliary LNA and a plurality of auxiliary electronic components downstream of the auxiliary LNA, the auxiliary LNA coupled to the output of the input matching network; and a coherent combiner to coherently combine complex digital baseband signals from the main receiver path and from the auxiliary receiver path to produce a single output signal.

In Example 2, the subject matter of Example 1 includes, wherein: the auxiliary receiver path has an auxiliary mixer configured to downconvert signals from the auxiliary LNA to baseband, the main receiver path has a main mixer configured to downconvert signals from the main LNA to baseband, and the main mixer and the auxiliary mixer are configured to downconvert signals in the same band to baseband using local oscillator (LO) signals from a first phase locked loop (PLL).

In Example 3, the subject matter of Example 2 includes, another receiver path having another LNA and a plurality of main electronic components downstream of the other LNA, the LNA coupled to an output of another input matching network configured to receive input signals at the antenna, wherein the other receiver path has another mixer configured to downconvert signals from the other LNA to baseband, and the main mixer and the other mixer are configured to downconvert signals in different bands to baseband using LO signals from a second PLL.

In Example 4, the subject matter of Examples 1-3 includes, wherein: the main electronic components comprise a main switch disposed between the main mixer and further electronic components of the main receiver path downstream of the main mixer, the main switch configured to switch between connecting the main LNA and the summer and connecting the other LNA and the summer and the auxiliary electronic components comprise an auxiliary switch disposed between the auxiliary mixer and further electronic components of the auxiliary receiver path downstream of the auxiliary mixer, the auxiliary switch configured to connect the auxiliary LNA and the summer when the main switch connects the main LNA and the summer.

In Example 5, the subject matter of Example 4 includes, wherein the auxiliary electronic components further comprise a calibration switch disposed between the auxiliary LNA and the auxiliary mixer, the calibration switch configured to disconnect the auxiliary LNA from the summer to provide calibration signals to other main electronic components of the main receiver path through the calibration switch, the auxiliary mixer, the auxiliary switch, and the main switch.

In Example 6, the subject matter of Examples 1-5 includes, wherein: the main receiver path has a main mixer to which a first local oscillator (LO) frequency is supplied, the main mixer configured to downconvert signals from the main LNA to baseband, the auxiliary receiver path has an auxiliary mixer configured to downconvert signals from the auxiliary LNA to baseband, and the receiver further comprises a multiplexer configured to select from among the first LO frequency and a second LO frequency to supply to the auxiliary mixer.

In Example 7, the subject matter of Examples 1-6 includes, wherein the output signals from the main receiver path represent main noise from the main LNA that is substantially non-correlated and main signal voltages that are correlated, the output signals from the auxiliary receiver path comprising auxiliary noise from the auxiliary LNA that is substantially non-correlated and auxiliary signal voltages that are correlated, the summer configured to coherently add together the output signals from the main receiver path and the auxiliary receiver path to reduce a noise figure of the receiver.

In Example 8, the subject matter of Examples 1-7 includes, a digital signal processor (DSP), the DSP configured to implement the summer.

In Example 9, the subject matter of Example 8 includes, wherein each of the auxiliary electronic components and the main electronic components comprise: a mixer configured to downconvert to baseband signals respectively from the main LNA or auxiliary LNA to form baseband signals; a filter configured to filter the baseband signals; a passive pole configured to provide lowpass filtering of signals from the filter; a sample and hold circuit and finite impulse response (FIR) filter to filter signals from the passive pole; and an analog-to-digital (ADC) to digitize signals from the sample and hold circuit and FIR filter to form digitized signals, the digitized signals supplied to the DSP.

In Example 10, the subject matter of Examples 1-9 includes, wherein: the main receiver path comprises a main mixer configured to downconvert signals from the main LNA, the main mixer configured to receive main oscillator signals from a main phase locked loop; and the auxiliary receiver path comprises an auxiliary mixer configured to downconvert signals from the auxiliary LNA, the auxiliary mixer configured to receive auxiliary oscillator signals from an auxiliary phase locked loop, the main oscillator signals and the auxiliary oscillator signals having the same frequency.

In Example 11, the subject matter of Examples 1-10 includes, wherein: the main receiver path comprises a main mixer configured to downconvert signals from the main LNA to form main downconverted signals, the main mixer configured to receive main oscillator signals from a main phase locked loop; and the auxiliary receiver path comprises an auxiliary mixer configured to downconvert signals from the auxiliary LNA to form auxiliary downconverted signals, the auxiliary mixer configured to receive auxiliary oscillator signals from an auxiliary phase locked loop, the main oscillator signals and the auxiliary oscillator signals having different frequencies.

In Example 12, the subject matter of Example 11 includes, wherein the main downconverted signals and the auxiliary downconverted signals have contiguous bandwidths.

In Example 13, the subject matter of Examples 11-12 includes, wherein the main downconverted signals and the auxiliary downconverted signals have non-contiguous bandwidths.

In Example 14, the subject matter of Examples 1-13 includes, wherein: the main receiver path comprises a main mixer configured to downconvert signals from the main LNA to form main downconverted signals, the main mixer configured to receive main oscillator signals from a main phase locked loop; and the auxiliary receiver path comprises an auxiliary mixer configured to downconvert signals from the auxiliary LNA to form auxiliary downconverted signals, the auxiliary mixer configured to receive auxiliary oscillator signals from an offset mixer connected with the main phase locked loop, the main downconverted signals and the auxiliary downconverted signals having contiguous bandwidths.

In Example 15, the subject matter of Examples 1-14 includes, wherein the main receiver path and the auxiliary receiver path are formed on a single die.

Example 16 is a mobile communication device, comprising: an antenna; and a receiver comprising: a plurality of low noise amplifiers (LNAs) configured to receive signals from the antenna via a common input matching network and provide amplified signals based on the signals; a plurality of mixers configured to downconvert the amplified signals using local oscillator (LO) signals to form baseband signals; a selector configured to select, among a plurality of LO signals of different frequencies, one of the LO signals to supply to at least one of the mixers; analog-to-digitals (ADCs) to digitize signals dependent on the amplified signals to produce digital signals, the digital signals from the different LNAs having signal voltages that are correlated and noise voltages that are substantially non-correlated; and a processor configured to, dependent on the selector, coherently combine the digital signals to reduce a noise figure of the receiver or increase a bandwidth of the digitized signals.

In Example 17, the subject matter of Example 16 includes, wherein the selector is configured to select the one of the LO signals such that the LO signals supplied to the mixers have a same frequency to reduce the noise figure of the receiver.

In Example 18, the subject matter of Examples 16-17 includes, wherein the selector is configured to select the one of the LO signals such that the LO signals supplied to the mixers have different frequencies, and bandwidths of the amplified signals downconverted are selectable to be contiguous or non-contiguous.

Example 19 is a method of reducing signal-to-noise ratio (SNR) in a receiver, the method comprising: amplifying signals from an antenna received via a common input matching network to form amplified signals to be provided along different receiver paths, the amplification introducing non-correlated noise during formation of the amplified signals; selecting, from among a plurality of local oscillator (LO) signals of different frequencies, one of the LO signals; downconverting, using mixer signals that include, the one of the LO signals, the amplified signals on the different receiver paths to form baseband signals; filtering the baseband signals to form filtered signals; digitizing signals dependent on the filtered signals to produce digital signals; and coherently combining the digital signals from the different receiver paths to, dependent on the one of the LO signals, reduce the non-correlated noise introduced when forming the amplified signals or increase a bandwidth of the digital signals.

In Example 20, the subject matter of Example 19 includes, dependent selecting whether to disconnect the amplified signals of one of the receiver paths from downstream components of the one of the receiver paths and instead introduce a calibration signal for filtering on another of the receiver paths after downconversion of the calibration signal on the one of the receiver paths.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20. For example, a main receiver path having a main means for amplifying and a plurality of main electronic components downstream of the main means for amplifying, the main means for amplifying coupled to an output of an input matching network configured to receive input signals received at an antenna; an auxiliary receiver path having an auxiliary means for amplifying and a plurality of auxiliary electronic components downstream of the auxiliary means for amplifying, the auxiliary means for amplifying coupled to the output of the input matching network; and a means for coherently combining complex digital baseband signals from the main receiver path and from the auxiliary receiver path to produce a single output signal. In another example, means for amplifying signals from an antenna received via a common input matching network to form amplified signals to be provided along different receiver paths, the amplification introducing non-correlated noise during formation of the amplified signals; means for selecting, from among a plurality of local oscillator (LO) signals of different frequencies, one of the LO signals; means for downconverting, using mixer signals that include, the one of the LO signals, the amplified signals on the different receiver paths to form baseband signals; filtering the baseband signals to form filtered signals; means for digitizing signals dependent on the filtered signals to produce digital signals; and means for coherently combining the digital signals from the different receiver paths to, dependent on the one of the LO signals, reduce the non-correlated noise introduced when forming the amplified signals or increase a bandwidth of the digital signals.

Example 23 is a system to implement of any of Examples 1-20.

Example 24 is a method to implement of any of Examples 1-20.

Although an aspect has been described with reference to specific example aspects, it will be evident that various modifications and changes may be made to these aspects without departing from the broader scope of the present disclosure. Accordingly, the specification and drawings are to be regarded in an illustrative rather than a restrictive sense. The accompanying drawings that form a part hereof show, by way of illustration, and not of limitation, specific aspects in which the subject matter may be practiced. The aspects illustrated are described in sufficient detail to enable those skilled in the art to practice the teachings disclosed herein. Other aspects may be utilized and derived therefrom, such that structural and logical substitutions and changes may be made without departing from the scope of this disclosure. This Detailed Description, therefore, is not to be taken in a limiting sense, and the scope of various aspects is defined only by the appended claims, along with the full range of equivalents to which such claims are entitled.

In some embodiments, various ones of the various components and modules described above may comprise software-based modules (e.g., code stored or otherwise embodied in a machine-readable medium or in a transmission medium), hardware modules, or any suitable combination thereof. A hardware module is a tangible (e.g., non-transitory) physical component (e.g., a set of one or more microcontrollers or microprocessors or other hardware-based devices) capable of performing certain operations. The one or more modules may be configured or arranged in a certain physical manner. In various embodiments, one or more microcontrollers or microprocessors, or one or more hardware modules thereof, may be configured by software (e.g., through an application or portion thereof) as a hardware module that operates to perform operations described herein for that module.

In some example embodiments, a hardware module may be implemented, for example, mechanically or electronically, or by any suitable combination thereof. For example, a hardware module may include dedicated circuitry or logic that is permanently configured to perform certain operations. A hardware module may be or include a special-purpose processor, such as a field-programmable gate array (FPGA) or an application specific integrated circuit (ASIC). A hardware module may also include programmable logic or circuitry that is temporarily configured by software to perform certain operations. As an example, a hardware module may include software encompassed within a central processing unit (CPU) or other programmable processor. It will be appreciated that a decision to implement a hardware module mechanically, electrically, in dedicated and permanently configured circuitry, or in temporarily configured circuitry (e.g., configured by software) may be driven by cost and time considerations.

In various embodiments, many of the components described may comprise one or more modules configured to implement the functions disclosed herein. In some embodiments, the modules may constitute software modules (e.g., code stored on or otherwise embodied in a machine-readable medium or in a transmission medium), hardware modules, or any suitable combination thereof. A "hardware module" is a tangible (e.g., non-transitory) physical component (e.g., a set of one or more microprocessors or other hardware-based devices) capable of performing certain operations and interpreting certain signals. The one or more modules may be configured or arranged in a certain physical manner. In various embodiments, one or more microprocessors or one or more hardware modules thereof may be configured by software (e.g., an application or portion thereof) as a hardware module that operates to perform operations described herein for that module.

In some example embodiments, a hardware module may be implemented, for example, mechanically or electronically, or by any suitable combination thereof. For example, a hardware module may include dedicated circuitry or logic that is permanently configured to perform certain operations. As noted above, a hardware module may comprise or include a special-purpose processor, such as an FPGA or an ASIC. A hardware module may also include programmable logic or circuitry that is temporarily configured by software to perform certain operations.

The description above includes illustrative examples, devices, systems, and methods that embody the disclosed subject matter. In the description, for purposes of explanation, numerous specific details were set forth in order to provide an understanding of various embodiments of the disclosed subject matter. It will be evident, however, to those of ordinary skill in the art that various embodiments of the subject matter may be practiced without these specific details. Further, well-known structures, materials, and techniques have not been shown in detail, so as not to obscure the various illustrated embodiments.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various combinations.

Although various embodiments are discussed separately, these separate embodiments are not intended to be considered as independent techniques or designs. As indicated above, each of the various portions may be inter-related and each may be used separately or in combination with other types of electrical control-devices. Consequently, although various embodiments of methods, operations, and processes have been described, these methods, operations, and processes may be used either separately or in various combinations.

Consequently, many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single aspect for the purpose of streamlining the disclosure. This method of disclosure is not to be interpreted as reflecting an intention that the claimed aspects require more features than are expressly recited in each claim. Rather, as the following claims reflect, inventive subject matter lies in less than all features of a single disclosed aspect. Thus, the following claims are hereby incorporated into the Detailed Description, with each claim standing on its own as a separate aspect.

What is claimed is:

1. A receiver comprising:
a main receiver path having a main low noise amplifier (LNA) and a plurality of main electronic components downstream of the main LNA, the main LNA coupled to an output of an input matching network configured to receive input signals received at an antenna;
an auxiliary receiver path having an auxiliary LNA and a plurality of auxiliary electronic components downstream of the auxiliary LNA, the auxiliary LNA coupled to the output of the input matching network; and
a summer to coherently combine complex digital baseband signals from the main receiver path and from the auxiliary receiver path to produce a single output signal,
wherein the main electronic components comprise a main switch disposed between a main mixer and further electronic components of the main receiver path downstream of the main mixer, the main switch configured to switch between connecting the main LNA and the summer and connecting the other LNA and the summer; and
the auxiliary electronic components comprise an auxiliary switch disposed between the auxiliary mixer and further electronic components of the auxiliary receiver path downstream of the auxiliary mixer, the auxiliary switch configured to connect the auxiliary LNA and the summer when the main switch connects the main LNA and the summer.

2. The receiver of claim 1, wherein:
the auxiliary receiver path has an auxiliary mixer configured to downconvert signals from the auxiliary LNA to baseband,
the main receiver path has a main mixer configured to downconvert signals from the main LNA to baseband, and
the main mixer and the auxiliary mixer are configured to downconvert signals in the same band to baseband using local oscillator (LO) signals from a first phase locked loop (PLL).

3. The receiver of claim 2, further comprising:
another receiver path having another LNA and a plurality of main electronic components downstream of the other LNA, the LNA coupled to an output of another input matching network configured to receive input signals at the antenna,
wherein the other receiver path has another mixer configured to downconvert signals from the other LNA to baseband, and
the main mixer and the other mixer are configured to downconvert signals in different bands to baseband using LO signals from a second PLL.

4. The receiver of claim 1, wherein the auxiliary electronic components further comprise a calibration switch disposed between the auxiliary LNA and the auxiliary mixer, the calibration switch configured to disconnect the auxiliary LNA from the summer to provide calibration signals to other main electronic components of the main receiver path through the calibration switch, the auxiliary mixer, the auxiliary switch, and the main switch.

5. The receiver of claim 1, wherein:
the main receiver path has a main mixer to which a first local oscillator (LO) frequency is supplied, the main mixer configured to downconvert signals from the main LNA to baseband,
the auxiliary receiver path has an auxiliary mixer configured to downconvert signals from the auxiliary LNA to baseband, and
the receiver further comprises a multiplexer configured to select from among the first LO frequency and a second LO frequency to supply to the auxiliary mixer.

6. The receiver of claim 1, further comprising a digital signal processor (DSP), the DSP configured to implement the summer.

7. The receiver of claim 6, wherein each of the auxiliary electronic components and the main electronic components comprise:
a mixer configured to downconvert to baseband signals respectively from the main LNA or auxiliary LNA to form baseband signals;
a filter configured to filter the baseband signals;
a passive pole configured to provide lowpass filtering of signals from the filter;
a sample and hold circuit and finite impulse response (FIR) filter to filter signals from the passive pole; and
an analog-to-digital (ADC) to digitize signals from the sample and hold circuit and FIR filter to form digitized signals, the digitized signals supplied to the DSP.

8. The receiver of claim 1, wherein:
the main receiver path comprises a main mixer configured to downconvert signals from the main LNA, the main mixer configured to receive main oscillator signals from a main phase locked loop; and
the auxiliary receiver path comprises an auxiliary mixer configured to downconvert signals from the auxiliary LNA, the auxiliary mixer configured to receive auxiliary oscillator signals from an auxiliary phase locked loop, the main oscillator signals and the auxiliary oscillator signals having the same frequency.

9. The receiver of claim 1, wherein the main receiver path and the auxiliary receiver path are formed on a single die.

10. A receiver comprising:
a main receiver path having a main low noise amplifier (LNA) and a plurality of main electronic components downstream of the main LNA, the main LNA coupled to an output of an input matching network configured to receive input signals received at an antenna;

an auxiliary receiver path having an auxiliary LNA and a plurality of auxiliary electronic components downstream of the auxiliary LNA, the auxiliary LNA coupled to the output of the input matching network; and a summer to coherently combine complex digital baseband signals from the main receiver path and from the auxiliary receiver path to produce a single output signal, wherein the output signals from the main receiver path represent main noise from the main LNA that is substantially non-correlated and main signal voltages that are correlated, the output signals from the auxiliary receiver path comprising auxiliary noise from the auxiliary LNA that is substantially non-correlated and auxiliary signal voltages that are correlated, the summer configured to coherently add together the output signals from the main receiver path and the auxiliary receiver path to reduce a noise figure of the receiver.

11. A receiver comprising:
a main receiver path having a main low noise amplifier (LNA) and a plurality of main electronic components downstream of the main LNA, the main LNA coupled to an output of an input matching network configured to receive input signals received at an antenna;
an auxiliary receiver path having an auxiliary LNA and a plurality of auxiliary electronic components downstream of the auxiliary LNA, the auxiliary LNA coupled to the output of the input matching network; and
a summer to coherently combine complex digital baseband signals from the main receiver path and from the auxiliary receiver path to produce a single output signal,
wherein the main receiver path comprises a main mixer configured to downconvert signals from the main LNA to form main downconverted signals, the main mixer configured to receive main oscillator signals from a main phase locked loop; and
the auxiliary receiver path comprises an auxiliary mixer configured to downconvert signals from the auxiliary LNA to form auxiliary downconverted signals, the auxiliary mixer configured to receive auxiliary oscillator signals from an auxiliary phase locked loop, the main oscillator signals and the auxiliary oscillator signals having different frequencies.

12. The receiver of claim 11, wherein the main downconverted signals and the auxiliary downconverted signals have contiguous bandwidths.

13. The receiver of claim 11, wherein the main downconverted signals and the auxiliary downconverted signals have non-contiguous bandwidths.

14. The receiver of claim 1, wherein:
the main receiver path comprises a main mixer configured to downconvert signals from the main LNA to form main downconverted signals, the main mixer configured to receive main oscillator signals from a main phase locked loop; and
the auxiliary receiver path comprises an auxiliary mixer configured to downconvert signals from the auxiliary LNA to form auxiliary downconverted signals, the auxiliary mixer configured to receive auxiliary oscillator signals from an offset mixer connected with the main phase locked loop, the main downconverted signals and the auxiliary downconverted signals having contiguous bandwidths.

15. A mobile communication device, comprising:
an antenna; and
a receiver comprising:
a plurality of low noise amplifiers (LNAs) configured to receive signals from the antenna via a common input matching network and provide amplified signals based on the signals;
a plurality of mixers configured to downconvert the amplified signals using local oscillator (LO) signals to form baseband signals;
a selector configured to select, among a plurality of LO signals of different frequencies, one of the LO signals to supply to at least one of the mixers;
analog-to-digitals (ADCs) to digitize signals dependent on the amplified signals to produce digital signals, the digital signals from the different LNAs having signal voltages that are correlated and noise voltages that are substantially non-correlated; and
a processor configured to, dependent on the selector, coherently combine the digital signals to reduce a noise figure of the receiver or increase a bandwidth of the digitized signals.

16. The mobile communication device of claim 15, wherein the selector is configured to select the one of the LO signals such that the LO signals supplied to the mixers have a same frequency to reduce the noise figure of the receiver.

17. The mobile communication device of claim 15, wherein the selector is configured to select the one of the LO signals such that the LO signals supplied to the mixers have different frequencies, and bandwidths of the amplified signals downconverted are selectable to be contiguous or non-contiguous.

18. A method of reducing signal-to-noise ratio (SNR) in a receiver, the method comprising:
amplifying signals from an antenna received via a common input matching network to form amplified signals to be provided along different receiver paths, the amplification introducing non-correlated noise during formation of the amplified signals;
selecting, from among a plurality of local oscillator (LO) signals of different frequencies, one of the LO signals;
downconverting, using mixer signals that include the one of the LO signals, the amplified signals on the different receiver paths to form baseband signals;
filtering the baseband signals to form filtered signals;
digitizing signals dependent on the filtered signals to produce digital signals; and
coherently combining the digital signals from the different receiver paths to, dependent on the one of the LO signals, reduce the non-correlated noise introduced when forming the amplified signals or increase a bandwidth of the digital signals.

19. The method of claim 18, further comprising dependent selecting whether to disconnect the amplified signals of one of the receiver paths from downstream components of the one of the receiver paths and instead introduce a calibration signal for filtering on another of the receiver paths after downconversion of the calibration signal on the one of the receiver paths.

20. A receiver, comprising:
a main receiver path having a main low noise amplifier (LNA) and a plurality of main electronic components downstream of the main LNA, the main LNA coupled to an output of an input matching network configured to receive input signals received at an antenna;
an auxiliary receiver path having an auxiliary LNA and a plurality of auxiliary electronic components downstream of the auxiliary LNA, the auxiliary LNA coupled to the output of the input matching network;

a summer to coherently combine complex digital baseband signals from the main receiver path and from the auxiliary receiver path to produce a single output signal; and a digital signal processor (DSP), the DSP configured to implement the summer, wherein each of the auxiliary electronic components and the main electronic components comprise:

a mixer configured to downconvert to baseband signals respectively from the main LNA or auxiliary LNA to form baseband signals;

a filter configured to filter the baseband signals;

a passive pole configured to provide lowpass filtering of signals from the filter;

a sample and hold circuit and finite impulse response (FIR) filter to filter signals from the passive pole; and an analog-to-digital (ADC) to digitize signals from the sample and hold circuit and FIR filter to form digitized signals, the digitized signals supplied to the DSP.

\* \* \* \* \*